United States Patent
Zhou et al.

(10) Patent No.: US 11,702,738 B2
(45) Date of Patent: Jul. 18, 2023

(54) CHAMBER PROCESSES FOR REDUCING BACKSIDE PARTICLES

(71) Applicant: Applied Materials, Inc., Santa Clara, CA (US)

(72) Inventors: Yi Zhou, Fremont, CA (US); Xinyue Chen, Sunnyvale, CA (US); Mukul Khosla, San Jose, CA (US); Yangchung Lee, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/322,242

(22) Filed: May 17, 2021

(65) Prior Publication Data

US 2022/0364227 A1   Nov. 17, 2022

(51) Int. Cl.
| | |
|---|---|
| C23C 16/44 | (2006.01) |
| C23C 16/455 | (2006.01) |
| C23C 16/40 | (2006.01) |
| H01J 37/32 | (2006.01) |

(52) U.S. Cl.
CPC ........ C23C 16/4404 (2013.01); C23C 16/401 (2013.01); C23C 16/4405 (2013.01); C23C 16/45557 (2013.01); H01J 37/32477 (2013.01); H01J 37/32853 (2013.01); H01J 37/32862 (2013.01)

(58) Field of Classification Search
None
See application file for complete search history.

(56) References Cited

U.S. PATENT DOCUMENTS

| | | | |
|---|---|---|---|
| 10,658,161 | B2 | 5/2020 | Wang et al. |
| 2003/0026917 | A1* | 2/2003 | Lin ................... H01J 37/32458 427/446 |
| 2005/0214455 | A1 | 9/2005 | Li et al. |
| 2006/0093756 | A1 | 5/2006 | Rajagopalan et al. |
| 2007/0246062 | A1* | 10/2007 | Lai ................... H01J 37/32862 134/1.1 |
| 2014/0190409 | A1 | 7/2014 | Matsumoto et al. |
| 2018/0374697 | A1* | 12/2018 | Agarwal ............. C23C 16/4412 |

(Continued)

FOREIGN PATENT DOCUMENTS

| | | |
|---|---|---|
| TW | 201921499 A | 6/2019 |
| TW | 202006170 A | 2/2020 |

(Continued)

OTHER PUBLICATIONS

International Search Report and Written Opinion dated Sep. 7, 2022 in International Patent Application No. PCT/US2022/029391, 10 pages.

*Primary Examiner* — Jose I Hernandez-Kenney
(74) *Attorney, Agent, or Firm* — Kilpatrick Townsend & Stockton LLP (57) ABSTRACT

Methods of semiconductor processing may include performing a first plasma treatment within a processing chamber to remove a first carbon-containing material. The methods may include performing a second plasma treatment within the processing chamber to remove a first silicon-containing material. The methods may include depositing a second silicon-containing material on surfaces of the processing chamber. The methods may include depositing a second carbon-containing material overlying the second silicon-containing material.

20 Claims, 3 Drawing Sheets

(56) References Cited

U.S. PATENT DOCUMENTS

2019/0115241 A1    4/2019   Vellore et al.
2021/0115557 A1    4/2021   Ko et al.
2021/0142990 A1    5/2021   Asahara et al.

FOREIGN PATENT DOCUMENTS

TW            I699854 B     7/2020
WO    WO-2021188340 A1 *   9/2021

* cited by examiner

CHAMBER PROCESSES FOR REDUCING BACKSIDE PARTICLES

TECHNICAL FIELD

The present technology relates to semiconductor systems, processes, and equipment. More specifically, the present technology relates to processes and systems to protect substrates on support assemblies.

BACKGROUND

Many substrate processing systems use substrate supports, such as an electrostatic chuck in combination with a base, to retain a wafer during semiconductor substrate processing. An embedded electrode may electrostatically chuck a wafer or substrate to the substrate support. A voltage may be applied to the electrode, which provides the clamping force. However, this clamping force may cause backside damage to the substrate, and also may produce backside particles that can cause issues in subsequent processing.

Thus, there is a need for improved systems and methods that can be used to improve lifetime and performance of processing chambers and components. These and other needs are addressed by the present technology.

SUMMARY

Methods of semiconductor processing may include performing a first plasma treatment within a processing chamber to remove a first carbon-containing material. The methods may include performing a second plasma treatment within the processing chamber to remove a first silicon-containing material. The methods may include depositing a second silicon-containing material on surfaces of the processing chamber. The methods may include depositing a second carbon-containing material overlying the second silicon-containing material.

In some embodiments, the methods may include positioning a substrate in the processing chamber subsequent depositing the second carbon-containing material. The methods may include performing an etch process on the substrate within the processing chamber. The methods may include removing the substrate from the processing chamber subsequent performing the etch process. The methods may include repeating the method of semiconductor processing. The first plasma treatment may form a plasma of an oxygen-containing precursor. The second plasma treatment may form a plasma of a fluorine-containing precursor. The second carbon-containing material may include a halogen, and the second silicon-containing material may be or include silicon oxide. The methods may include increasing a processing pressure prior between performing the first plasma treatment and performing the second plasma treatment. The second plasma treatment may include forming a plasma of one or more fluorine-containing precursors while maintaining the processing chamber at a first processing pressure. The methods may include reducing the first processing pressure to a second processing pressure. The methods may include forming a plasma of one or more fluorine-containing precursors while maintaining the processing chamber at the second processing pressure. The methods may include halting a flow of a silicon-containing precursor while maintaining a plasma in the processing chamber subsequent depositing the second silicon-containing material on surfaces of the processing chamber.

Some embodiments of the present technology may encompass methods of semiconductor processing. The methods may include depositing a silicon-containing material on exposed surfaces of a processing chamber. The methods may include depositing a carbon-containing material overlying the silicon-containing material within the processing chamber. The methods may include performing an etch process on a substrate housed within the processing chamber. The methods may include performing a first plasma treatment within the processing chamber to remove the carbon-containing material. The methods may include performing a second plasma treatment within the processing chamber to remove the silicon-containing material.

In some embodiments, the substrate may be seated on the carbon-containing material on an electrostatic chuck within the processing chamber. The silicon-containing material may be or include silicon oxide. The carbon-containing material may be or include a fluorinated carbon. The first plasma treatment may include contacting the carbon-containing material with plasma effluents of an oxygen-containing precursor. The second plasma treatment may include contacting the silicon-containing material with plasma effluents of a fluorine-containing precursor. The methods may include increasing a processing pressure prior between performing the first plasma treatment and performing the second plasma treatment. The second plasma treatment may include forming a plasma of one or more fluorine-containing precursors while maintaining the processing chamber at a first processing pressure. The methods may include reducing the first processing pressure to a second processing pressure. The methods may include forming a plasma of one or more fluorine-containing precursors while maintaining the processing chamber at the second processing pressure. The silicon-containing material and the carbon-containing material each may be characterized by a thickness of less than or about 100 nm.

Some embodiments of the present technology may encompass methods of semiconductor processing. The methods may include depositing a silicon-containing material on exposed surfaces of a processing chamber. The silicon-containing material may be characterized by an average surface roughness of greater than or about 3 nm. The methods may include performing an etch process on a substrate housed within the processing chamber. The methods may include performing a plasma treatment within the processing chamber to remove the silicon-containing material. In some embodiments, the silicon-containing material may be characterized by a water contact angle of greater than or about 90°.

Such technology may provide numerous benefits over conventional systems and techniques. For example, the processes may reduce localized chucking force at locations across the substrate support, while still affording sufficient global chucking force. Additionally, the processes may reduce or limit backside particles, which may facilitate downstream processing. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma etching processes may energize one or more constituent precursors to facilitate material removal from a substrate. The conditions of the process may cause a substrate to be dislodged or shifted if not properly clamped. Additionally, the formed films on a substrate may cause stresses on the substrate. For example, as processing may include more films to produce complex structures, thicker layers of material may be developed on a substrate. These produced films may be characterized by internal stresses that act upon the substrate. This may cause a substrate to bow during processing, which if not controlled can lead to poor uniformity of removal, as well as device damage or malfunction.

An electrostatic chuck may be used to produce a clamping action against the substrate to overcome the bowing stress and maintain the substrate during etch processes. However, as these device structures increase in thickness and complexity, the stresses acted upon the substrate increase, which may require a proportional increase in chucking voltage. Additionally, many etch processes may be performed at relatively high temperatures that further affect components of the chamber. For example, some etch activities may occur at temperatures of several hundred degrees or higher, which may cause the substrate to thermally expand outward radially. The expansion, in combination with the increased chucking voltage, may cause scratches to be formed on the backside of a semiconductor substrate in contact with the substrate support, as well as cause particles to be dislodged from the underlying chuck body.

As one non-limiting example, many processes may utilize a coating within the chamber, which may act to protect chamber components during semiconductor processing. However, this coating may interact with the wafer. For example, an oxide chamber coating may extend across the electrostatic chuck. The substrate may be positioned overlying the chuck and coating. Because an oxide layer may be characterized by higher hydrophilicity, an amount of stiction may occur between the material and the substrate that may be clamped and forcibly constrained against the material. Subsequent clamping, as the substrate acclimates to the chamber temperature, the thermal expansion may cause an amount of the oxide layer coating to be separated from the rest of the coating, and which may adhere to the backside of the substrate as particulate material after dechuck.

These scratches and particles may cause multiple challenges. For example, when a substrate is removed from processing and replaced in a front-opening unified pod with other processed substrates, particles generated from the contact may fall to underlying substrates, which may act as defects in the produced films for the underlying substrates. Additionally, some subsequent processing may be affected by the damage. For example, subsequent operations may include lithography. Backside damage may cause displacement of the projected beam through the substrate, which may affect the lithography process, or the particles may impact the sensitive lithography base. These issues have limited conventional technologies and caused loss of wafers due to the impact on subsequent processing, as well as damage to lithographic components. The present technology overcomes these challenges by forming a hydrophobic coating overlying a substrate support, which may limit stiction between the coating and the substrate. This may limit substrate particle formation in terms of material removed from the substrate support, especially at increased temperatures.

Although the remaining disclosure will routinely identify specific etching and cleaning processes utilizing the disclosed technology, it will be readily understood that the systems and methods are equally applicable to a variety of other processes as may occur in the described chambers. Accordingly, the technology should not be considered to be so limited as for use with the described etching or cleaning processes alone. The disclosure will discuss one possible system and chamber that can be used with the present technology before describing systems and methods or operations of exemplary process sequences according to some embodiments of the present technology. It is to be understood that the technology is not limited to the equipment described, and processes discussed may be performed in any number of processing chambers and systems.

Figure 1:
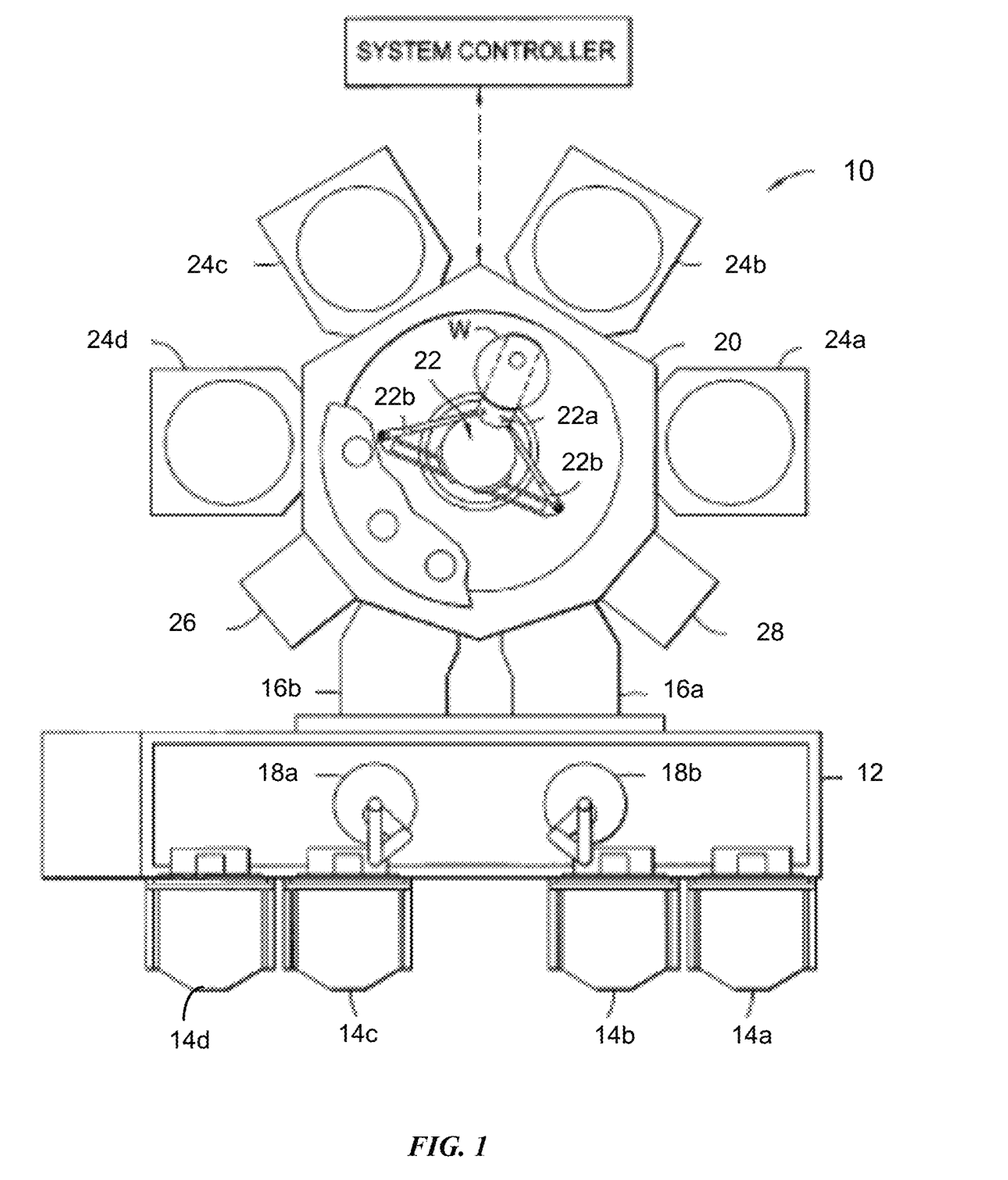
FIG. 1 shows a schematic top plan view of an exemplary processing system according to some embodiments of the present technology.

FIG. 1 shows a top plan view of one embodiment of a processing system 10 of deposition, etching, baking, and/or curing chambers according to embodiments. The tool or processing system 10 depicted in FIG. 1 may contain a plurality of process chambers, 24a-d, a transfer chamber 20, a service chamber 26, an integrated metrology chamber 28, and a pair of load lock chambers 16a-b. The process chambers may include any number of structures or components, as well as any number or combination of processing chambers.

To transport substrates among the chambers, the transfer chamber 20 may contain a robotic transport mechanism 22. The transport mechanism 22 may have a pair of substrate transport blades 22a attached to the distal ends of extendible arms 22b, respectively. The blades 22a may be used for carrying individual substrates to and from the process chambers. In operation, one of the substrate transport blades such as blade 22a of the transport mechanism 22 may retrieve a substrate W from one of the load lock chambers such as chambers 16a-b and carry substrate W to a first stage of processing, for example, a treatment process as described below in chambers 24a-d. The chambers may be included to perform individual or combined operations of the described technology. For example, while one or more chambers may be configured to perform a deposition or etching operation, one or more other chambers may be configured to perform a pre-treatment operation and/or one or more post-treatment operations described. Any number of configurations are encompassed by the present technology, which may also perform any number of additional fabrication operations typically performed in semiconductor processing.

If the chamber is occupied, the robot may wait until the processing is complete and then remove the processed substrate from the chamber with one blade 22a and may insert a new substrate with a second blade. Once the substrate is processed, it may then be moved to a second stage of processing. For each move, the transport mechanism 22 generally may have one blade carrying a substrate and one blade empty to execute a substrate exchange. The transport mechanism 22 may wait at each chamber until an exchange can be accomplished.

Once processing is complete within the process chambers, the transport mechanism 22 may move the substrate W from the last process chamber and transport the substrate W to a cassette within the load lock chambers 16a-b. From the load lock chambers 16a-b, the substrate may move into a factory interface 12. The factory interface 12 generally may operate to transfer substrates between pod loaders 14a-d in an atmospheric pressure clean environment and the load lock chambers 16a-b. The clean environment in factory interface 12 may be generally provided through air filtration processes, such as HEPA filtration, for example. Factory interface 12 may also include a substrate orienter/aligner that may be used to properly align the substrates prior to processing. At least one substrate robot, such as robots 18a-b, may be positioned in factory interface 12 to transport substrates between various positions/locations within factory interface 12 and to other locations in communication therewith. Robots 18a-b may be configured to travel along a track system within factory interface 12 from a first end to a second end of the factory interface 12.

The processing system 10 may further include an integrated metrology chamber 28 to provide control signals, which may provide adaptive control over any of the processes being performed in the processing chambers. The integrated metrology chamber 28 may include any of a variety of metrological devices to measure various film properties, such as thickness, roughness, composition, and the metrology devices may further be capable of characterizing grating parameters such as critical dimensions, sidewall angle, and feature height under vacuum in an automated manner.

Each of processing chambers 24a-d may be configured to perform one or more process steps in the fabrication of a semiconductor structure, and any number of processing chambers and combinations of processing chambers may be used on multi-chamber processing system 10. For example, any of the processing chambers may be configured to perform a number of substrate processing operations including any number of deposition processes including cyclical layer deposition, atomic layer deposition, chemical vapor deposition, physical vapor deposition, as well as other operations including etch, pre-clean, pre-treatment, post-treatment, anneal, plasma processing, degas, orientation, and other substrate processes. Some specific processes that may be performed in any of the chambers or in any combination of chambers may be metal deposition, surface cleaning and preparation, thermal annealing such as rapid thermal processing, and plasma processing. Any other processes may similarly be performed in specific chambers incorporated into multi-chamber processing system 10, including any process described below, as would be readily appreciated by the skilled artisan.

Figure 2:
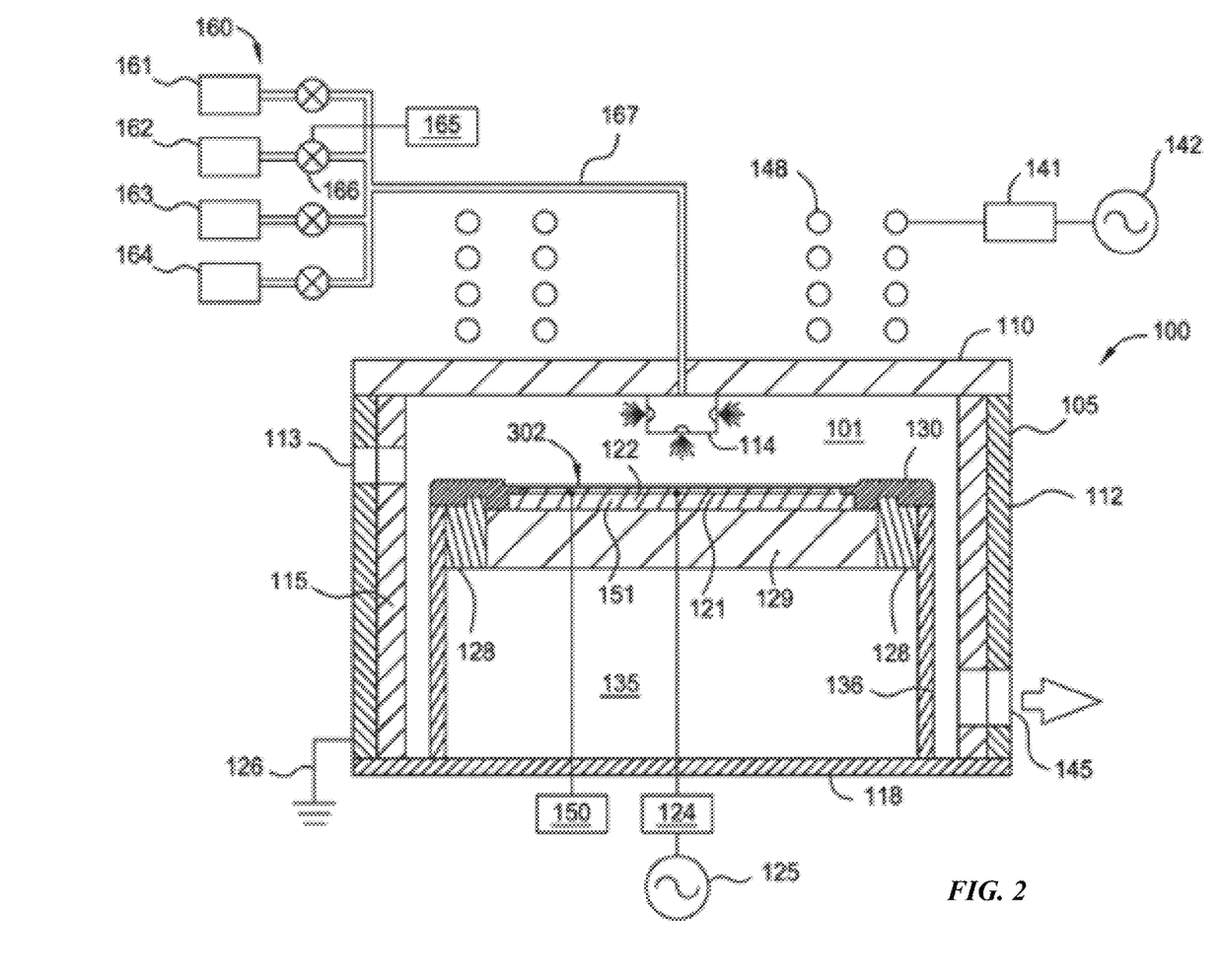
FIG. 2 shows a schematic cross-sectional view of an exemplary processing system according to some embodiments of the present technology.

FIG. 2 illustrates a schematic cross-sectional view of an exemplary processing chamber 100 suitable for patterning a material layer disposed on a substrate 302 in the processing chamber 100. The exemplary processing chamber 100 is suitable for performing a patterning process, although it is to be understood that aspects of the present technology may be performed in any number of chambers, and substrate supports according to the present technology may be included in etching chambers, deposition chambers, treatment chambers, or any other processing chamber. The plasma processing chamber 100 may include a chamber body 105 defining a chamber volume 101 in which a substrate may be processed. The chamber body 105 may have sidewalls 112 and a bottom 118 which are coupled with ground 126. The sidewalls 112 may have a liner 115 to protect the sidewalls 112 and extend the time between maintenance cycles of the plasma processing chamber 100. The dimensions of the chamber body 105 and related components of the plasma processing chamber 100 are not limited and generally may be proportionally larger than the size of the substrate 302 to be processed therein. Examples of substrate sizes include 200 mm diameter, 250 mm diameter, 300 mm diameter and 450 mm diameter, among others, such as display or solar cell substrates as well.

The chamber body 105 may support a chamber lid assembly 110 to enclose the chamber volume 101. The chamber body 105 may be fabricated from aluminum or other suitable materials. A substrate access port 113 may be formed through the sidewall 112 of the chamber body 105, facilitating the transfer of the substrate 302 into and out of the plasma processing chamber 100. The access port 113 may be coupled with a transfer chamber and/or other chambers of a substrate processing system as previously described. A pumping port 145 may be formed through the sidewall 112 of the chamber body 105 and connected to the chamber volume 101. A pumping device may be coupled through the pumping port 145 to the chamber volume 101 to evacuate and control the pressure within the processing volume. The pumping device may include one or more pumps and throttle valves.

A gas panel 160 may be coupled by a gas line 167 with the chamber body 105 to supply process gases into the chamber volume 101. The gas panel 160 may include one or more process gas sources 161, 162, 163, 164 and may additionally include inert gases, non-reactive gases, and reactive gases, as may be utilized for any number of processes. Examples of process gases that may be provided by the gas panel 160 include, but are not limited to, hydrocarbon containing gas including methane, sulfur hexafluoride, silicon chloride, carbon tetrafluoride, hydrogen bromide, hydrocarbon containing gas, argon gas, chlorine, nitrogen, helium, or oxygen gas, as well as any number of additional materials. Additionally, process gasses may include nitrogen, chlorine, fluorine, oxygen, and hydrogen containing gases such as $BCl_3$, $C_2F_4$, $C_4F_8$, $C_4F_6$, $CHF_3$, $CH_2F_2$, $CH_3F$, $NF_3$, $NH_3$, $CO_2$, $SO_2$, $CO$, $N_2$, $NO_2$, $N_2O$, and $H_2$, among any number of additional precursors.

Valves 166 may control the flow of the process gases from the sources 161, 162, 163, 164 from the gas panel 160 and may be managed by a controller 165. The flow of the gases supplied to the chamber body 105 from the gas panel 160 may include combinations of the gases form one or more sources. The lid assembly 110 may include a nozzle 114. The nozzle 114 may be one or more ports for introducing the process gases from the sources 161, 162, 164, 163 of the gas panel 160 into the chamber volume 101. After the process gases are introduced into the plasma processing chamber 100, the gases may be energized to form plasma. An antenna 148, such as one or more inductor coils, may be provided adjacent to the plasma processing chamber 100. An antenna power supply 142 may power the antenna 148 through a match circuit 141 to inductively couple energy, such as RF energy, to the process gas to maintain a plasma formed from the process gas in the chamber volume 101 of the plasma processing chamber 100. Alternatively, or in addition to the antenna power supply 142, process electrodes below the substrate 302 and/or above the substrate 302 may be used to capacitively couple RF power to the process gases to maintain the plasma within the chamber volume 101. The operation of the power supply 142 may be controlled by a controller, such as controller 165, that also controls the operation of other components in the plasma processing chamber 100.

A substrate support pedestal 135 may be disposed in the chamber volume 101 to support the substrate 302 during processing. The substrate support pedestal 135 may include an electrostatic chuck 122 for holding the substrate 302 during processing. The electrostatic chuck ("ESC") 122 may use the electrostatic attraction to hold the substrate 302 to the substrate support pedestal 135. The ESC 122 may be powered by an RF power supply 125 integrated with a match circuit 124. The ESC 122 may include an electrode 121 embedded within a dielectric body. The electrode 121 may be coupled with the RF power supply 125 and may provide a bias which attracts plasma ions, formed by the process gases in the chamber volume 101, to the ESC 122 and substrate 302 seated on the pedestal. The RF power supply 125 may cycle on and off, or pulse, during processing of the substrate 302. The ESC 122 may have an isolator 128 for the purpose of making the sidewall of the ESC 122 less attractive to the plasma to prolong the maintenance life cycle of the ESC 122. Additionally, the substrate support pedestal 135 may have a cathode liner 136 to protect the sidewalls of the substrate support pedestal 135 from the plasma gases and to extend the time between maintenance of the plasma processing chamber 100.

Electrode 121 may be coupled with a power source 150. The power source 150 may provide a chucking voltage of about 200 volts to about 2000 volts to the electrode 121. The power source 150 may also include a system controller for controlling the operation of the electrode 121 by directing a DC current to the electrode 121 for chucking and de-chucking the substrate 302. The ESC 122 may include heaters disposed within the pedestal and connected to a power source for heating the substrate, while a cooling base 129 supporting the ESC 122 may include conduits for circulating a heat transfer fluid to maintain a temperature of the ESC 122 and substrate 302 disposed thereon. The ESC 122 may be configured to perform in the temperature range required by the thermal budget of the device being fabricated on the substrate 302. For example, the ESC 122 may be configured to maintain the substrate 302 at a temperature of about −150° C. or lower to about 500° C. or higher depending on the process being performed.

The cooling base 129 may be provided to assist in controlling the temperature of the substrate 302. To mitigate process drift and time, the temperature of the substrate 302 may be maintained substantially constant by the cooling base 129 throughout the time the substrate 302 is in the cleaning chamber. In some embodiments, the temperature of the substrate 302 may be maintained throughout subsequent cleaning processes at temperatures between about −150° C. and about 500° C., although any temperatures may be utilized. A cover ring 130 may be disposed on the ESC 122 and along the periphery of the substrate support pedestal 135. The cover ring 130 may be configured to confine etching gases to a desired portion of the exposed top surface of the substrate 302, while shielding the top surface of the substrate support pedestal 135 from the plasma environment inside the plasma processing chamber 100. Lift pins may be selectively translated through the substrate support pedestal 135 to lift the substrate 302 above the substrate support pedestal 135 to facilitate access to the substrate 302 by a transfer robot or other suitable transfer mechanism as previously described.

The controller 165 may be utilized to control the process sequence, regulating the gas flows from the gas panel 160 into the plasma processing chamber 100, and other process parameters. Software routines, when executed by the CPU, transform the CPU into a specific purpose computer such as a controller, which may control the plasma processing chamber 100 such that the processes are performed in accordance with the present disclosure. The software routines may also be stored and/or executed by a second controller that may be associated with the plasma processing chamber 100.

Figure 3:
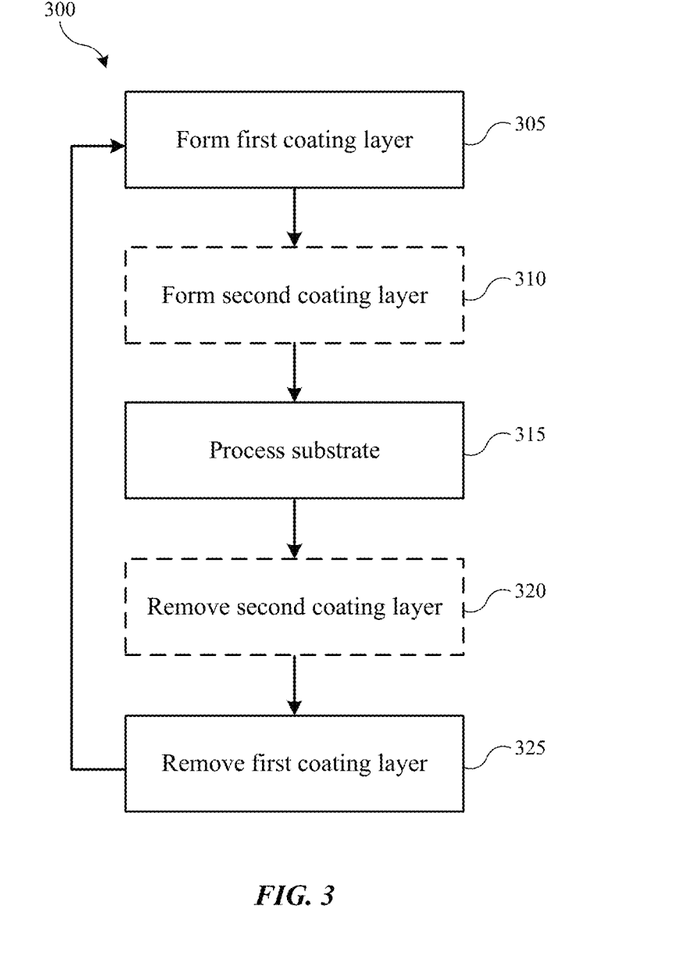
FIG. 3 shows selected operations in a method of semiconductor processing according to some embodiments of the present technology.

The processing chambers explained above may be used during methods according to embodiments of the present technology. FIG. 3 illustrates a method 300 of processing a semiconductor substrate, operations of which may be performed, for example, in one or more chambers 100 incorporated on multi-chamber processing system 10 as previously described. Any other chamber may also be utilized, which may perform one or more operations of any method or process described. Method 300 may include one or more operations prior to the initiation of the stated method operations, including front end processing, deposition, etching, polishing, cleaning, or any other operations that may be performed prior to the described operations. The method may include a number of optional operations as denoted in the figure, which may or may not specifically be associated with the method according to the present technology. For example, many of the operations are described in order to provide a broader scope of the semiconductor process, but are not critical to the technology, or may be performed by alternative methodology as will be discussed further below.

Method 300 may include a number of operations that may be performed in a number of variations, such as including beginning at different operations of processing. Method 300 may generally include a coating and cleaning set of operations that may occur in chambers in which etch processes may be performed. Often, the coating may be performed prior to positioning the substrate within the processing chamber to perform semiconductor processing, and the cleaning set of operations may be performed subsequent the processing, and may occur once the substrate has been removed. Accordingly, although method 300 will be described in a particular order, it is to be understood that the method may be performed in a number of different variations according to embodiments of the present technology.

At operation 305, the method may include forming a layer of material on surfaces of a substrate processing chamber. For example, an oxide coating, such as a silicon oxide coating, may be formed overlying surfaces of the chamber. Any number of silicon-containing precursors may be used in the processing, and in some embodiments a silicon-containing precursor may be delivered to the processing chamber. Silicon-containing precursors that may be used during processing according to some embodiments of the present technology may include silane, disilane, silicon tetrafluoride, silicon tetrachloride, dichlorosilane, tetraethyl orthosilicate, as well as any other silicon-containing precursors that may be used in silicon-containing film formation. Along with the silicon-containing precursor may be delivered an oxidizing gas, which may be or include any oxygen-containing precursor. For example, oxygen-containing precursors may include one or more of diatomic oxygen, ozone, water vapor, an alcohol, nitric oxide, nitrous oxide, or any other oxygen-containing materials.

During the deposition, process pressures may be maintained anywhere between about 3 mT and about 300 mT. Higher process pressures may reduce buildup of coating material in apertures formed within delivery components, for example. However, in some embodiments, the process pressure maintained within the processing chamber during any formation or deposition operations may be less than the process pressure maintained during processing operations performed on a substrate. For example, by maintaining a lower pressure than during processing, a more comprehensive coverage may be produced due to increased residence time. Consequently, when a higher-pressure etch process may be performed, the flow profile during the etch process may not extend beyond coverage aspects of the processing chamber. During the formation, the process may include halting flow of the silicon-containing precursor prior to extinguishing the plasma within the processing chamber. The oxygen-containing precursor flow rate may be maintained subsequent halting the silicon-containing precursor flow rate, which may allow oxygen-plasma effluents to terminate dangling bonds on a surface of the silicon oxide coating.

Subsequent formation of the silicon-containing layer, a second layer may be formed overlying the silicon-containing layer. As explained previously, the silicon-containing material, such as silicon oxide, may be more prone to adhere to a backside of a substrate, and during thermal expansion the substrate may remove part of the oxide layer due to stiction. Accordingly, by forming a less hydrophilic layer, the present technology may limit material transfer to a backside of the substrate, while also increasing mobility across the coatings, which may lower backside damage as well.

In some embodiments, the present technology may form a second layer of material as described further below. Additionally, with or without a second layer of material, the present technology may produce the oxide coating in a way to increase surface roughness of the film. For example, in some embodiments, the silicon oxide material may be formed to increase a surface roughness in order to increase a hydrophobicity of the film, which may reduce stiction between the coating and the backside of the substrate. For example, in some embodiments, the material may be formed to increase grain size or increase low-frequency plasma to increase bombardment, any of which may increase surface roughness across the film. Hence, in some embodiments, an average roughness of the oxide film may be greater than or about 0.5 nm, and may be greater than or about 1.0 nm, greater than or about 1.5 nm, greater than or about 2.0 nm, greater than or about 2.5 nm, greater than or about 3.0 nm, greater than or about 3.5 nm, greater than or about 4.0 nm, greater than or about 4.5 nm, greater than or about 5.0 nm, or more. However, when the surface becomes increasingly rough, backside scratches on the substrate may increase. Accordingly, in some embodiments the average roughness may be maintained less than or about 8.0 nm, and may be maintained at less than or about 7.5 nm, less than or about 7.0 nm, less than or about 6.5 nm, less than or about 6.0 nm, less than or about 5.5 nm, less than or about 5.0 nm, or less.

The oxide film, as well as any overlying material as described below, may also be characterized by producing a specific water contact angle that may increase hydrophobicity, and may reduce the likelihood of transfer from the oxide coating to the backside of the substrate. For example, while more hydrophilic oxide materials may be characterized by a produced water contact angle of less than or about 50°, in some embodiments, the surface roughness may produce an effective water contact angle of greater than or about 90°, and may produce a water contact angle of greater than or about 100°, greater than or about 110°, greater than or about 120°, greater than or about 130°, greater than or about 140°, greater than or about 150°, greater than or about 160°, or more.

Additionally, or alternatively, in some embodiments the present technology may include forming an additional layer overlying the oxide layer. For example, at optional operation 310, the present technology may include forming a second coating layer overlying the first. The second coating layer may be or include a carbon-containing layer, a halogen-containing layer, or both. For example, in some embodiments a halogen-and-carbon-containing precursor may be provided to produce a layer of material overlying the oxide layer. Exemplary precursors may be or include any number of carbon-containing or organic precursors, as well as halogen-substituted hydrocarbon precursors. For example, precursors may be or include fluoromethane, trifluoromethane, or any other material including carbon, a halogen, and/or hydrogen. Either of the silicon-containing material and/or the carbon-containing material, as well as a combination of the two layers, may be characterized by a thickness of greater than or 20 nm, and may be greater than or about 30 nm, greater than or about 40 nm, greater than or about 50 nm, greater than or about 60 nm, greater than or about 70 nm, greater than or about 80 nm, greater than or about 90 nm, greater than or about 100 nm, greater than or about 110 nm, greater than or about 120 nm, greater than or about 130 nm, greater than or about 140 nm, greater than or about 150 nm, or more.

Subsequent coating the chamber, method 300 may include processing a substrate at operation 315. The substrate may be positioned in the processing chamber, such as on an electrostatic chuck or other substrate support. The substrate may be seated directly in contact with the carbon-containing material, and while seated and/or electrostatically clamped, may be heated from an incoming temperature to a processing temperature, which may be greater than or about 100° C. higher than the incoming temperature. The substrate may include layers or materials conventionally employed in the fields of microelectronics, nanotechnology, photovoltaics, or any other semiconductor processes. The process may include plasma etching of the substrate within the processing chamber. The process may include selectively etching materials on the substrate, such as with one or more of a halogen-containing precursor, an oxygen-containing precursor, a hydrogen-containing precursor, and/or an inert precursor. Once the processing has been completed, methods may include removing the substrate from the processing chamber.

Although the etch process may include oxygen-plasma processing, which may impact or etch the exposed carbon-containing material, the substrate may be seated over the carbon-containing material on the chuck, which may protect that portion or the coating, and which may allow the coating to functionally prevent transfer or damage to the backside of the substrate. Once the substrate has been removed, the coatings may be removed in one or more cleaning operations. For example, a first plasma treatment may be performed at optional operation 320, to remove the remaining carbon-containing material, when applied. For example, a plasma of an oxygen-containing precursor, such as any precursor previously described, may be formed to remove the carbon-containing material.

Subsequent the first removal operation, a second plasma treatment may be performed at operation 325 to remove the silicon-containing material. The second plasma treatment may be performed using one or more halogen-containing precursors, as will be described further below. In some embodiments, once the cleaning operations have been completed, subsequent processing may involve preparing the processing chamber for additional substrates. For example, in some embodiments the method may include repeating one or more operations described previously, such as performing one or more coating operations, including a silicon-containing material and a carbon-containing material, on surfaces of the chamber prior to processing an additional substrate.

The removal operations may include operations to separately remove coating materials from the processing chamber. In some embodiments, the cleaning processes may include additional operations to ensure adequate removal of materials. For example, after the carbon-containing material has been removed, the process may include a multi-operation removal process to remove the silicon-containing material. For example, subsequent the oxygen-containing plasma treatment to remove the carbon-containing precursor, a pressure ramp may be performed to increase the chamber pressure. A flow rate of one or more precursors may be increased, which may increase a pressure within the processing chamber. As one non-limiting example, an inert precursor utilized in the first plasma treatment and the second plasma treatment may be used to increase the chamber pressure.

For example, in some embodiments, the carbon-containing precursor may be removed during a plasma operation at a chamber operating pressure of less than or about 50 mTorr, and may be removed at less than or about 40 mTorr, less than or about 30 mTorr, less than or about 20 mTorr, less than or about 10 mTorr, or less. Once the operation completes, the pressure may be increased to greater than or about 50 mTorr, greater than or about 100 mTorr, greater than or about 200 mTorr, greater than or about 300 mTorr, greater than or about 400 mTorr, greater than or about 500 mTorr, or greater. By starting the second plasma treatment or removal with a higher pressure, an increased removal rate may be afforded of the silicon-containing precursor. The second removal process may utilize a fluorine-containing precursor, which may include any fluorine-containing precursor, including sulfur hexafluoride, carbon tetrafluoride, nitrogen trifluoride, as well as any other fluorine-containing precursor. The high-pressure removal may also include an additional etchant and/or an additional oxidizing species in some embodiments of the present technology. For example, by including an additional fluorine-containing precursor or an additional chlorine-containing precursor, byproducts from previous removal operations or etch operations may be more readily removed from the chamber.

By performing a high-pressure removal, the cleaning operation performed may first remove material deposited onto the chamber coating during the etch processing previously performed, and may also remove a considerable amount of the chamber coating. Subsequent the first portion of the second plasma treatment or removal operation, the processing pressure may be reduced to a second processing pressure, which may be lower than the first pressure of the second plasma treatment, and may be any of the pressure ranges discussed above. The lower pressure may remove any remainder material within the processing chamber. A low pressure process may enhance the removal of coatings by increasing the mean free path of materials, which may increase the residence time, as well as the access and removal of residual coating materials. Additionally, a plasma may be maintained during the transition from the high-pressure clean to the low-pressure clean to avoid striking plasma at low pressure, which may be more challenging.

During any of the processing operations, other reactive species such as a chlorine-containing precursor may be added or substituted for any of the precursors previously described. A plasma power for any operation may be maintained at greater than or about 500 W, and may be maintained at greater than or about 1000 W, greater than or about 1500 W, greater than or about 2000 W, greater than or about 2500 W, greater than or about 3000 W, greater than or about 3500 W, greater than or about 4000 W, or higher, which may improve plasma stability in some embodiments. An RF bias power may be included at any power, but in some embodiments may be maintained relatively low to avoid damage to the substrate support. By incorporating additional coatings, which may be more hydrophobic, the present technology may limit scratching and particle transfer on the backside of the substrate.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the coating" includes reference to one or more coatings and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of semiconductor processing, the method comprising:
performing a first plasma treatment within a processing chamber to remove a first carbon-containing material;
performing a second plasma treatment within the processing chamber to remove a first silicon-containing material;
increasing a processing pressure between performing the first plasma treatment and performing the second plasma treatment;
depositing a second silicon-containing material on surfaces of the processing chamber, wherein the second silicon-containing material is characterized by a water contact angle of greater than or about 90°; and
depositing a second carbon-containing material overlying the second silicon-containing material.

2. The method of semiconductor processing of claim 1, further comprising:
positioning a substrate in the processing chamber subsequent depositing the second carbon-containing material; and
performing an etch process on the substrate within the processing chamber.

3. The method of semiconductor processing of claim 2, further comprising:
removing the substrate from the processing chamber subsequent performing the etch process; and
repeating the method of semiconductor processing.

4. The method of semiconductor processing of claim 1, wherein the first plasma treatment forms a plasma of an oxygen-containing precursor.

5. The method of semiconductor processing of claim 1, wherein the second plasma treatment forms a plasma of a fluorine-containing precursor.

6. The method of semiconductor processing of claim 1, wherein the second carbon-containing material comprises a halogen, and wherein the second silicon-containing material comprises silicon oxide.

7. The method of semiconductor processing of claim 1, wherein the second plasma treatment comprises:
forming a plasma of one or more fluorine-containing precursors while maintaining the processing chamber at a first processing pressure;
reducing the first processing pressure to a second processing pressure; and
forming a plasma of one or more fluorine-containing precursors while maintaining the processing chamber at the second processing pressure.

8. The method of semiconductor processing of claim 1, further comprising:
halting a flow of a silicon-containing precursor while maintaining a plasma in the processing chamber subsequent depositing the second silicon-containing material on surfaces of the processing chamber.

9. The method of semiconductor processing of claim 1, wherein the second silicon-containing material is characterized by an average surface roughness of greater than or about 3 nm.

10. The method of semiconductor processing of claim 1, wherein the second silicon-containing material is characterized by an average surface roughness of greater than or about 3 nm.

11. A method of semiconductor processing, the method comprising:
depositing a silicon-containing material on exposed surfaces of a processing chamber, wherein the silicon-containing material is characterized by a water contact angle of greater than or about 90°;
depositing a carbon-containing material overlying the silicon-containing material within the processing chamber;
performing an etch process on a substrate housed within the processing chamber;
performing a first plasma treatment within the processing chamber to remove the carbon-containing material; and
performing a second plasma treatment within the processing chamber to remove the silicon-containing material.

12. The method of semiconductor processing of claim 11, wherein the substrate is seated on the carbon-containing material on an electrostatic chuck within the processing chamber.

13. The method of semiconductor processing of claim 11, wherein the silicon-containing material comprises silicon oxide.

14. The method of semiconductor processing of claim 11, wherein the carbon-containing material comprises a fluorinated carbon.

15. The method of semiconductor processing of claim 11, wherein the first plasma treatment comprises:
contacting the carbon-containing material with plasma effluents of an oxygen-containing precursor.

16. The method of semiconductor processing of claim 11, wherein the second plasma treatment comprises:
contacting the silicon-containing material with plasma effluents of a fluorine-containing precursor.

17. The method of semiconductor processing of claim 1, further comprising:
increasing a processing pressure between performing the first plasma treatment and performing the second plasma treatment.

18. The method of semiconductor processing of claim 11, wherein the second plasma treatment comprises:
forming a plasma of one or more fluorine-containing precursors while maintaining the processing chamber at a first processing pressure;
reducing the first processing pressure to a second processing pressure; and
forming a plasma of one or more fluorine-containing precursors while maintaining the processing chamber at the second processing pressure.

19. The method of semiconductor processing of claim 11, wherein the silicon-containing material and the carbon-containing material are each characterized by a thickness of less than or about 100 nm.

20. A method of semiconductor processing, the method comprising:
depositing a silicon-containing material on exposed surfaces of a processing chamber, wherein the silicon-containing material is characterized by an average surface roughness of greater than or about 3 nm, and wherein the silicon-containing material is characterized by a water contact angle of greater than or about 90°;
performing an etch process on a substrate housed within the processing chamber; and
performing a plasma treatment within the processing chamber to remove the silicon-containing material.

* * * * *